United States Patent
Park

(10) Patent No.: US 8,624,278 B2
(45) Date of Patent: Jan. 7, 2014

(54) LIGHT EMITTING DEVICE WITH CURRENT BLOCKING LAYER

(75) Inventor: Hyung Jo Park, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/167,651

(22) Filed: Jun. 23, 2011

(65) Prior Publication Data

US 2011/0248298 A1 Oct. 13, 2011

Related U.S. Application Data

(63) Continuation of application No. 12/433,464, filed on Apr. 30, 2009, now Pat. No. 7,989,834.

(30) Foreign Application Priority Data

Apr. 30, 2008 (KR) .................. 10-2008-0040672
May 8, 2008 (KR) .................. 10-2008-0042601
May 8, 2008 (KR) .................. 10-2008-0042603

(51) Int. Cl.
*H01L 33/32* (2010.01)

(52) U.S. Cl.
USPC ...................... 257/94; 257/E33.025

(58) Field of Classification Search
USPC .......... 257/13, 79, 82, 85, 86, 90, 94, 98, 257/E33.011, E33.01, E21.021, E33.054, 257/E25.028, E25.032, E33.034, E33.03, 257/E33.025
See application file for complete search history.

(56) References Cited

U.S. PATENT DOCUMENTS

| | | | |
|---|---|---|---|
| 5,814,839 A | 9/1998 | Hosoba | |
| 6,469,313 B2 | 10/2002 | Kim et al. | |
| 6,583,443 B1 * | 6/2003 | Chang et al. | 257/79 |
| 6,797,987 B2 | 9/2004 | Chen | |
| 7,247,985 B2 | 7/2007 | Kaneko et al. | |
| 7,442,569 B2 | 10/2008 | Lee et al. | |
| 7,498,609 B2 | 3/2009 | Murofushi et al. | |
| 7,659,553 B2 | 2/2010 | Kato et al. | |
| 7,675,076 B2 | 3/2010 | Otsuka et al. | |
| 2001/0012307 A1 | 8/2001 | Hayakawa | |
| 2002/0061041 A1 | 5/2002 | Kobayashi | |
| 2004/0264533 A1 * | 12/2004 | Matsumura et al. | 372/45 |
| 2005/0098801 A1 | 5/2005 | Ikeda et al. | |
| 2006/0002442 A1 | 1/2006 | Haberern et al. | |
| 2006/0163586 A1 * | 7/2006 | Denbaars et al. | 257/79 |
| 2006/0203867 A1 * | 9/2006 | Imai | 372/43.01 |
| 2007/0018177 A1 | 1/2007 | Lee et al. | |
| 2007/0091965 A1 | 4/2007 | Tanabe et al. | |
| 2007/0145391 A1 | 6/2007 | Baik et al. | |
| 2007/0181889 A1 | 8/2007 | Orita | |
| 2008/0048206 A1 | 2/2008 | Lee et al. | |
| 2009/0278144 A1 | 11/2009 | Sonobe et al. | |
| 2009/0278163 A1 | 11/2009 | Sakamoto et al. | |

FOREIGN PATENT DOCUMENTS

| | | |
|---|---|---|
| DE | 197 45 723 A1 | 10/1998 |
| EP | 1 696 494 A1 | 8/2006 |
| JP | 1-295469 A | 11/1989 |
| JP | 2-181980 A | 7/1990 |

(Continued)

*Primary Examiner* — Selim Ahmed

(74) *Attorney, Agent, or Firm* — Birch, Stewart, Kolasch & Birch, LLP

(57) ABSTRACT

A light emitting device comprises a second electrode layer; a second conductivity-type semiconductor layer on the second electrode layer; a current blocking layer comprising an oxide of the second conductivity-type semiconductor layer; an active layer on the second conductivity-type semiconductor layer; a first conductivity-type semiconductor layer on the active layer; and a first electrode layer on the first conductivity-type semiconductor layer.

20 Claims, 8 Drawing Sheets

(56) References Cited

FOREIGN PATENT DOCUMENTS

| | | |
|---|---|---|
| JP | 2-253661 A | 10/1990 |
| JP | 2-288372 A | 11/1990 |
| JP | 2003-163417 A | 6/2003 |
| JP | 2004-111648 A | 4/2004 |
| JP | 2004-311869 A | 11/2004 |
| JP | 2005-159299 A | 6/2005 |
| JP | 2007-180504 A | 7/2007 |
| JP | 2007-184644 A | 7/2007 |
| JP | 3940933 B2 | 7/2007 |
| JP | 2007-214260 A | 8/2007 |
| JP | 2007-299935 A | 11/2007 |
| JP | 2007-335793 A | 12/2007 |
| JP | 2008-53425 A | 3/2008 |
| KR | 1996-0032781 A | 9/1996 |
| KR | 10-2005-0043638 A | 5/2005 |
| KR | 10-2007-0011916 A | 1/2007 |
| KR | 10-0706952 B1 | 4/2007 |
| KR | 10-0723150 B1 | 5/2007 |
| KR | 10-2007-0082278 A | 8/2007 |
| KR | 10-2008-0018084 A | 2/2008 |
| WO | WO 2004/082033 A | 9/2004 |
| WO | WO 2006/011936 A2 | 2/2006 |
| WO | WO 2007/040149 A1 | 4/2007 |
| WO | WO 2007/063833 A1 | 6/2007 |

* cited by examiner

2

LIGHT EMITTING DEVICE WITH CURRENT BLOCKING LAYER

This application is a Continuation of application Ser. No. 12/433,464 filed on Apr. 30, 2009, now U.S. Pat. No. 7,989,834 which claims priority to Korean Patent Application No. 10-2008-0040672, filed on Apr. 30, 2008, Korean Patent Application No. 10-2008-0042601, filed on May 8, 2008, and Korean Patent Application No. 10-2008-0042603, filed on May 8, 2008. The entire contents of all of the above applications are hereby incorporated by reference.

BACKGROUND

The present disclosure relates to a light emitting device and a method for manufacturing the same.

Recently, many studies have been conducted on devices that use light emitting diodes (LEDs) as light emitting devices.

An LED is a device that converts an electric signal into light by using characteristics of compound semiconductors. An LED has a stacked structure with a semiconductor layer of a first conductivity type, an active layer, and a semiconductor layer of a second conductivity type, and emits light from the active layer when a voltage is applied. The first conductivity-type semiconductor layer may be an n-type semiconductor layer and the second conductivity-type semiconductor layer may be a p-type semiconductor layer, and vice versa.

Meanwhile, in a vertical LED structure where a first electrode layer applying a voltage to the first conductivity-type semiconductor layer and a second electrode layer applying a voltage to the second conductivity-type semiconductor layer are arranged in a vertical direction, electric current may not flow in a wide area and may flow with concentration on a lower side of the first electrode layer. If the electric current flows with concentration on a specific region, an operating voltage may increase to lower the intensity of light, thus degrading the reliability of the light emitting device.

Furthermore, there is a need to improve light extraction efficiency so that light emitted from the active layer is effectively extracted to the outside.

SUMMARY

Embodiments provide a light emitting device having a new structure, and a method for manufacturing the same.

Embodiments also provide a light emitting device having improved light extraction efficiency, and a method for manufacturing the same.

Embodiments also provide a light emitting device capable of suppressing electric current from flowing with concentration on a specific region, and a method for manufacturing the same.

Embodiments also provide a light emitting device capable of operating a stable driving voltage, and a method for manufacturing the same.

In an embodiment, a light emitting device comprises: a second electrode layer; a second conductivity-type semiconductor layer on the second electrode layer; a current blocking layer comprising an oxide of the second conductivity-type semiconductor layer; an active layer on the second conductivity-type semiconductor layer; a first conductivity-type semiconductor layer on the active layer; and a first electrode layer on the first conductivity-type semiconductor layer.

In an embodiment, a light emitting device comprises: a second electrode layer; a second conductivity-type semiconductor layer on the second electrode layer; an active layer on the second conductivity-type semiconductor layer; a first conductivity-type semiconductor layer on the active layer; a current blocking layer in the first conductivity-type semiconductor layer; and a first electrode layer on the first conductivity-type semiconductor layer.

In an embodiment, a light emitting device comprises: a second electrode layer; a second conductivity-type semiconductor layer on the second electrode layer; an active layer on the second conductivity-type semiconductor layer; a first conductivity-type semiconductor layer on the active layer, the first conductivity-type semiconductor layer comprising a first nitride layer and a second nitride layer; and a first electrode layer on the first conductivity-type semiconductor layer.

DETAILED DESCRIPTION OF THE PREFERRED EMBODIMENTS

Figure 1:
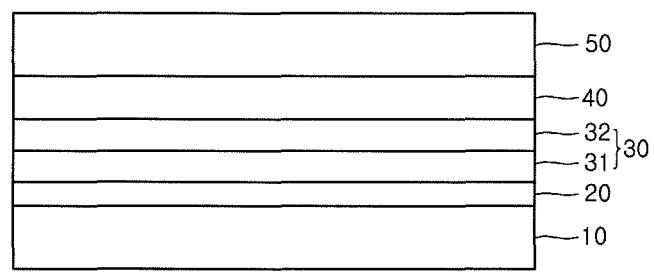
FIGS. 1 to 6 are sectional views explaining a light emitting device and a method for manufacturing the same according to a first embodiment.

In the following description, it will be understood that when a layer (or film) is referred to as being "on" another layer or substrate, it can be directly on the other layer or substrate, or intervening layers may also be present. Further, it will be understood that when a layer is referred to as being "under" another layer, it can be directly under the other layer, and one or more intervening layers may also be present. In addition, it will also be understood that when a layer is referred to as being "between" two layers, it can be the only layer between the two layers, or one or more intervening layers may also be present.

In the drawings, the thicknesses of layers and regions are exaggerated for clarity. Also, the size of each element does not entirely reflect an actual size.

Hereinafter, light emitting devices and methods for manufacturing the same according to embodiments will be described in detail with reference to the accompanying drawings.

FIGS. 1 to 6 are sectional views explaining a light emitting device and a method for manufacturing the same according to a first embodiment.

Figure 6:
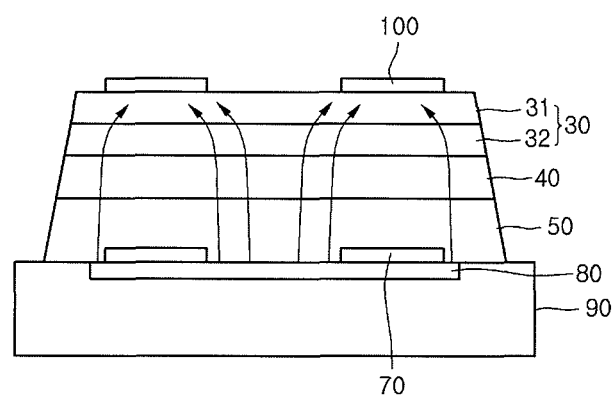

Referring to FIG. 6, the light emitting device according to the first embodiment includes a second electrode layer 90, an ohmic contact layer 80 on the second electrode layer 90, a second conductivity-type semiconductor layer 50 on the ohmic contact layer 80, an active layer 40, a first conductivity-type semiconductor layer 30, and a first electrode 100 on the first conductivity-type semiconductor layer 30.

Also, a current blocking layer 70 for changing a current path is disposed on the second conductivity-type semiconductor layer 50.

A bottom surface and a side surface of the ohmic contact layer 80 may be in contact with the second electrode layer 90. A top surface of the ohmic contact layer 80 and a top surface of the second electrode layer 90 may be disposed on the same horizontal plane.

The first electrode layer 100 and the ohmic contact layer 80 are disposed in a vertical direction. The first electrode layer 100 and the second electrode layer 90 may be disposed in a vertical direction. That is, at least portions of the first electrode layer 100 and the ohmic contact layer 80 or the second electrode layer 90 may be disposed on the same vertical plane.

In the light emitting device according to the first embodiment, the current blocking layer 70 is disposed inside the second conductivity-type semiconductor layer 50. The current blocking layer 70 may be disposed at a boundary between the second conductivity-type semiconductor layer 50 and the ohmic contact layer 80. For example, a top surface and a side surface of the current blocking layer 70 may be in contact with the second conductivity-type semiconductor layer 50, and a bottom surface of the current blocking layer 70 may be in contact with the ohmic contact layer 80.

The current blocking layer 70 may be formed of a material having an insulating characteristic, and the current blocking layer 70 may be formed of oxide by oxidizing the second conductivity-type semiconductor layer 50. The current blocking layer 70 may be formed of $Ga_xO_y$, which is formed by a plasma oxidation process, and may have a thickness of about 10 nm to about 100 nm.

As indicated by an arrow in FIG. 6, due to the formation of the current blocking layer 70, the current flowing from the ohmic contact layer 80 to the first electrode layer 100 does not concentrate on the lower side of the first electrode layer 100, and flows in a wide area over the first conductivity-type semiconductor layer 30.

Therefore, it is possible to prevent the current concentration phenomenon that the electric current flows with concentration on the lower side of the first electrode layer 100. Consequently, the light emitting device can operate at a stable operating voltage and the light emission efficiency can be improved.

Moreover, the first conductivity-type semiconductor layer 30 may include a first nitride layer 31 and a second nitride layer 32. The first nitride layer 31 may be formed of a medium layer having a lower refractive index than the second nitride layer 32. In other words, the second nitride layer 32 may be formed of a medium layer having a higher refractive index than the first nitride layer 31.

The first nitride layer 31 may be formed of $Al_xGa_{1-x}N$ (0<x≤1), for example, n-AlGaN or n-AlN, and the second layer 32 may be formed of n-GaN. When the wavelength of light emitted from the active layer 40 is 450 nm, the refractive index of GaN is about 2.44 and the refractive index of AlGaN or AlN is about 2.12 to about 2.44.

The refractive index of AlGaN changes to about 2.12 to about 2.44 according to a composition ratio of Al to Ga. When the content of Al is relatively larger than that of Ga, the refractive index becomes lower, thus increasing the light extraction efficiency.

In the light emitting device according to the first embodiment, since the first conductivity-type semiconductor layer 30 includes the first nitride layer 31 and the second nitride layer 32, light that is emitted from the active layer and incident onto the second nitride layer 32 can be effectively extracted through the first nitride layer 31 to the outside. Consequently, the light emission efficiency of the light emitting device can be improved.

Figure 7:
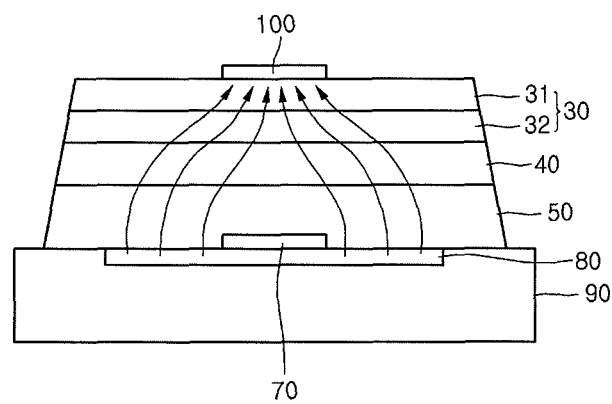
FIG. 7 is a sectional view explaining a light emitting device according to a second embodiment.
Figure 8:
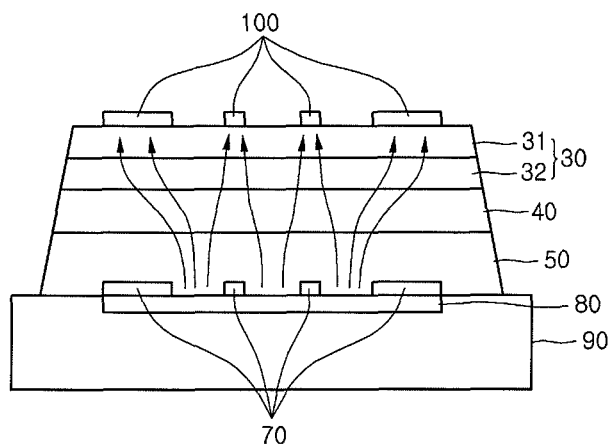
FIG. 8 is a sectional view explaining a light emitting device according to a third embodiment of the present invention.

FIG. 7 is a sectional view of a light emitting device according to a second embodiment, and FIG. 8 is a sectional view of a light emitting device according to a third embodiment.

The fundamental characteristics of the light emitting devices of FIGS. 7 and 8 are similar to those of the light emitting device of FIG. 6. However, in the light emitting devices of FIGS. 7 and 8, the current blocking layer 70 is modified in the position, size and number. The position of the first electrode layer 100 may be changed according to the position, size and number of the current blocking layer 70.

In the embodiments, the current blocking layer 70 may be disposed in a central region of the bottom surface of the second conductivity-type semiconductor layer 50, or a region other than the central region. Furthermore, the current blocking layer 70 may have at least two different sizes.

Hereinafter, a method for manufacturing a light emitting device according to a first embodiment will be described in detail with reference to FIGS. 1 to 6.

Referring to FIG. 1, an undoped GaN layer 20, a first conductivity-type semiconductor layer 30, an active layer 40, and a second conductivity-type semiconductor layer 50 are formed on a substrate 10. A buffer layer (not shown) may be further formed between the substrate 10 and the undoped GaN layer 20.

The substrate 10 may be formed of at least one of sapphire ($Al_2O_3$), Si, SiC, GaAs, ZnO, or MgO.

The buffer layer may include a multi-layer with a stacked structure such as AlInN/GaN, $In_xGa_{1-x}N$/GaN, and $Al_xInyGa_{1-x-y}N$/$In_xGa_{1-x}N$/GaN. For example, the buffer layer may be grown by injecting trimethylgallium (TMGa), trimethylindium (TMIn), and trimethylaluminum (TMAl) into the chamber together with hydrogen gas and ammonia gas.

The undoped GaN layer 20 may be grown by injecting trimethylgallium (TMGa) into the chamber together with hydrogen gas and ammonia gas.

The first conductivity-type semiconductor layer 30 may be a nitride semiconductor layer doped with impurity ions of the first conductivity type, and the first conductivity-type semiconductor layer 30 may include a first nitride layer 31 having a low refractive index and a second nitride layer 32 having a high refractive index.

The first conductivity-type semiconductor layer 30 may be a semiconductor layer doped with n-type impurity ions. The first conductivity-type semiconductor layer 30 may be grown by injecting trimethylgallium (TMGa), trimethylaluminum (TMAl), and silane gas ($SiN_4$) containing n-type impurities (for example, Si) into the chamber together with hydrogen gas and ammonia gas.

The active layer 40 and the second conductivity-type semiconductor layer 50 are formed on the first conductivity-type semiconductor layer 30.

The active layer 40 may be formed in a single quantum well structure or a multi-quantum well structure. For example, the active layer 40 may be formed in a stacked structure of an InGaN well layer/a GaN barrier layer.

The second conductivity-type semiconductor layer 50 may be a nitride semiconductor layer doped with impurity ions of the second conductivity type. For example, the second conductivity-type semiconductor layer 50 may be a semiconductor layer doped with p-type impurity ions. The second conductivity-type semiconductor layer 50 may be grown by injecting bis(ethylcyclopentadienyl)magnesium ($EtCp_2Mg$) {$Mg(C_2H_5C_5H_4)_2$} into the chamber together with hydrogen gas and ammonia gas.

Figure 2:
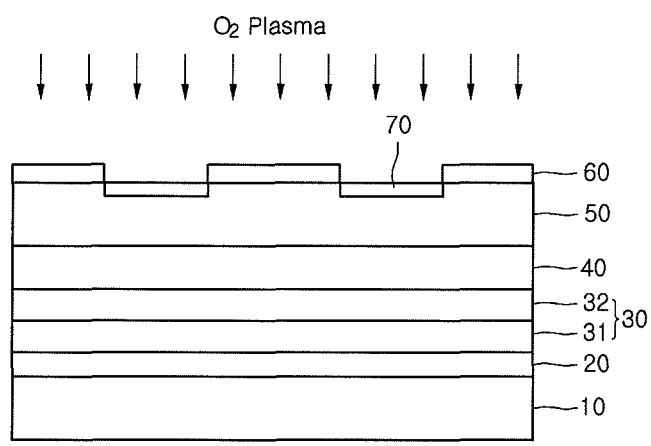

Referring to FIG. 2, a mask 60 is formed on the second conductivity-type semiconductor layer 50, and a current blocking layer 70 is selectively formed by $O_2$ plasma.

The current blocking layer 70 may be formed of oxide, for example, $Ga_xO_y$. The current blocking layer 70 may be represented by the following chemical formula.

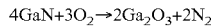

$$4GaN+3O_2 \rightarrow 2Ga_2O_3+2N_2$$

Meanwhile, the current blocking layer 70 may be formed as illustrated in FIG. 7 or 8 according to patterns of the mask 60.

Figure 3:
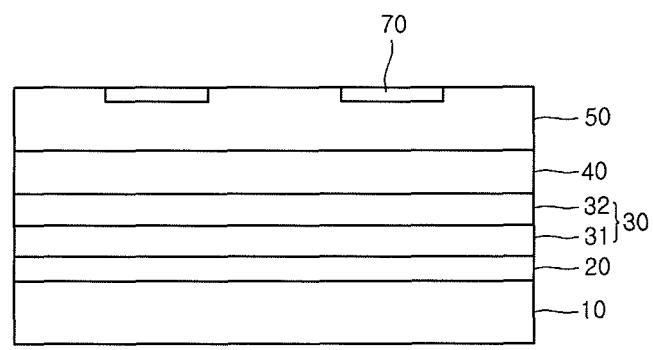

Referring to FIG. 3, after forming the current blocking layer 70, the mask 60 is removed.

Figure 4:
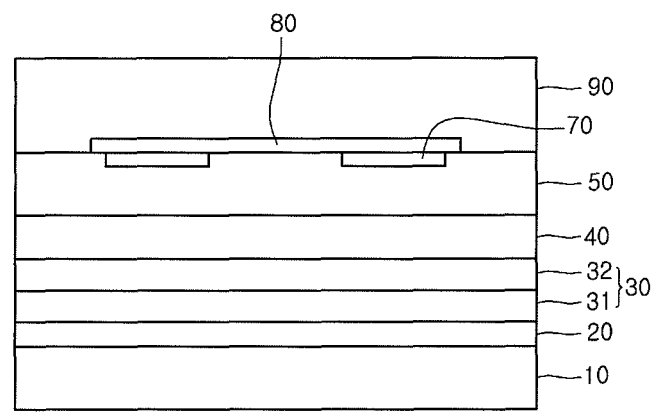

Referring to FIG. 4, an ohmic contact layer 80 and a second electrode layer 90 are formed on the second conductivity-type semiconductor layer 50 and the current blocking layer 70.

The ohmic contact layer 80 may include a transparent electrode layer. For example, the ohmic contact layer 80 may be formed of at least one of indium tin oxide (ITO), ZnO, $RuO_x$, $TiO_x$, or $IrO_x$.

Also, the ohmic contact layer 80 may include at least one of a reflective layer and an adhesive layer.

The second electrode layer 90 may be formed of at least one of copper (Cu), titan (Ti), chrome (Cr), nickel (Ni), aluminum (Al), platinum (Pt), gold (Au), or a conductive substrate.

Figure 5:
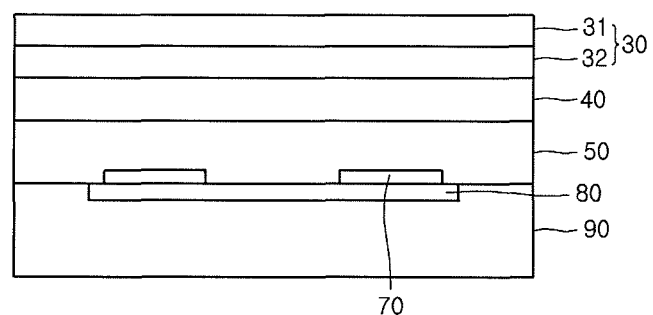

Referring to FIG. 5, the substrate 10 and the undoped GaN layer 20 are removed from the structure of FIG. 4. If the buffer layer has been formed, the buffer layer is also removed.

Referring to FIG. 6, an isolation etching process for chip separation is performed on the structure of FIG. 5.

A first electrode layer 100 is formed on the first conductivity-type semiconductor layer 30. The first electrode layer 100 may be formed of at least one of copper (Cu), titan (Ti), chrome (Cr), nickel (Ni), aluminum (Al), platinum (Pt), or gold (Au).

In this way, the light emitting device of FIG. 6 can be manufactured.

FIGS. 9 to 15 are sectional views explaining a light emitting device and a method for manufacturing the same according to a fourth embodiment.

Figure 15:
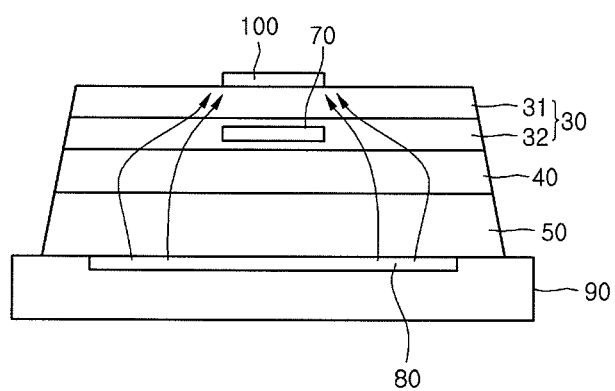

Referring to FIG. 15, the light emitting device according to the fourth embodiment includes a second electrode layer 90, an ohmic contact layer 80 on the second electrode layer 90, a second conductivity-type semiconductor layer 50 on the ohmic contact layer 80, an active layer 40, a first conductivity-type semiconductor layer 30, and a first electrode 100 on the first conductivity-type semiconductor layer 30. Also, a current blocking layer 70 for changing a current path is disposed on the first conductivity-type semiconductor layer 30.

A bottom surface and a side surface of the ohmic contact layer 80 may be in contact with the second electrode layer 90. A top surface of the ohmic contact layer 80 and a top surface of the second electrode layer 90 may be disposed on the same horizontal plane.

The first electrode layer 100 and the ohmic contact layer 80 are disposed in a vertical direction. The first electrode layer 100 and the second electrode layer 90 may be disposed in a vertical direction. That is, at least a portion of the first electrode layer 100 and the ohmic contact layer 80 or the second electrode layer 90 may be disposed on the same vertical plane.

In the light emitting device according to the fourth embodiment, the current blocking layer 70 is disposed inside the first conductivity-type semiconductor layer 30 under the first electrode layer 100. The current blocking layer 70 is formed of an insulating material. The current blocking layer 70 may be formed of at least one of $SiO_2$, $SiN_x$, $TiO_2$, $Ta_2O_3$, SiOn, and SiCN.

As indicated by an arrow in FIG. 15, due to the formation of the current blocking layer 70, the current flowing from the ohmic contact layer 80 to the first electrode layer 100 does not concentrate on the lower side of the first electrode layer 100, and flows in a wide area over the first conductivity-type semiconductor layer 30.

Therefore, it is possible to prevent the current concentration phenomenon that the electric current flows with concentration on the lower side of the first electrode layer 100. Consequently, the light emitting device can operate at a stable operating voltage and the light emission efficiency can be improved.

Moreover, the first conductivity-type semiconductor layer 30 may include a first nitride layer 31 and a second nitride layer 32. The first nitride layer 31 may be formed of a medium layer having a lower refractive index than the second nitride layer 32. In other words, the second nitride layer 32 may be formed of a medium layer having a higher refractive index than the first nitride layer 31.

In this embodiment, the current blocking layer 70 is formed in the second nitride layer 32.

The first nitride layer 31 may be formed of $Al_xGa_{1-x}N$ ($0<x\leq1$), for example, n-AlGaN or n-AlN, and the second layer 32 may be formed of n-GaN. When the wavelength of light emitted from the active layer 40 is 450 nm, the refractive index of GaN is about 2.44 and the refractive index of AlGaN or AlN is about 2.12 to about 2.44.

The refractive index of AlGaN changes to about 2.12 to about 2.44 according to a composition ratio of Al to Ga. When the content of Al is relatively larger than that of Ga, the refractive index becomes lower, thus increasing the light extraction efficiency.

In the light emitting device according to the fourth embodiment, since the first conductivity-type semiconductor layer 30 includes the first nitride layer 31 and the second nitride layer 32, light that is emitted from the active layer and incident onto the second nitride layer 32 can be effectively extracted through the first nitride layer 31 to the outside. Consequently, the light emission efficiency of the light emitting device can be improved.

Figure 16:
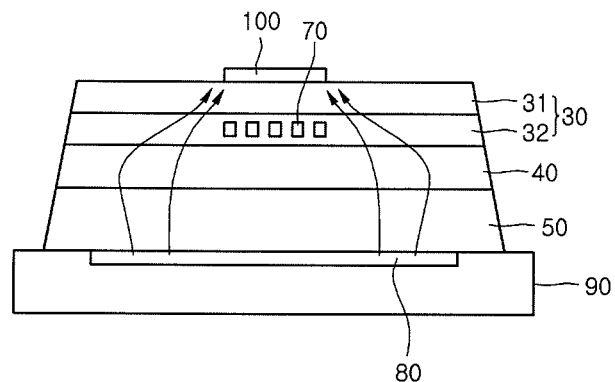
FIG. 16 is a sectional view explaining a light emitting device according to a fifth embodiment.

FIG. 16 is a sectional view of a light emitting device according to a fifth embodiment.

The fundamental characteristics of the light emitting device of FIG. 16 are similar to those of the light emitting device of FIG. 15. However, in the light emitting device of FIG. 16, the current blocking layer 70 is partially provided in plurality.

When the current blocking layer 70 is partially provided in plurality, the first conductivity-type semiconductor layer 30 can be grown more easily.

Since the electric current also flows between the current blocking layers 70, the current spreading effect can be maximized.

Figure 17:
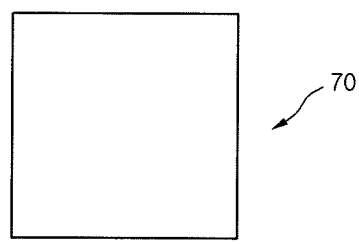
FIG. 17 is a plan view of a current blocking layer illustrated in FIG. 15.
Figure 18:
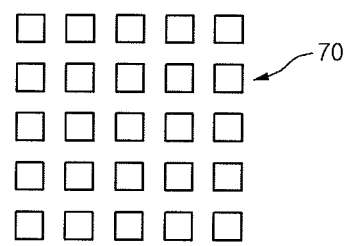
FIG. 18 is a plan view of a current blocking layer illustrated in FIG. 16.

FIG. 17 is a plan view of the current blocking layer illustrated in FIG. 15, and FIG. 18 is a plan view of the current blocking layer illustrated in FIG. 16.

As illustrated in FIGS. 15 and 16, the first conductivity-type semiconductor layer 30 is also grown on the current blocking layer 70. As illustrated in FIG. 18, when the current blocking layer 70 is divided into a plurality of layers and spaced apart from one another, the first conductivity-type semiconductor layer 30 can be grown between the current blocking layers 70.

Hereinafter, a method for manufacturing a light emitting device according to a fourth embodiment will be described in detail with reference to FIGS. 9 to 15.

Figure 9:
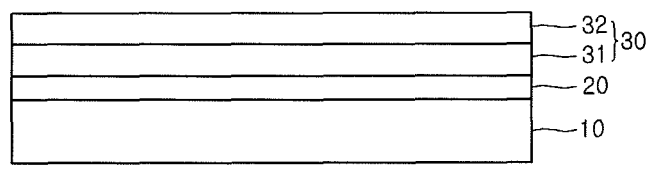
FIGS. 9 to 15 are sectional views explaining a light emitting device and a method for manufacturing the same according to a fourth embodiment.

Referring to FIG. 9, an undoped GaN layer 20 and a first conductivity-type semiconductor layer 30 are formed on a substrate 10. A buffer layer (not shown) may be further formed between the substrate 10 and the undoped GaN layer 20.

The substrate 10 may be formed of at least one of sapphire ($Al_2O_3$), Si, SiC, GaAs, ZnO, or MgO.

The buffer layer may include a multi-layer with a stacked structure such as AlInN/GaN, $In_xGa_{1-x}$N/GaN, and $Al_xIn_yGa_{1-x-y}$N/$In_xGa_{1-x}$N/GaN. For example, the buffer layer may be grown by injecting trimethylgallium (TMGa), trimethylindium (TMIn), and trimethylaluminum (TMAl) into the chamber together with hydrogen gas and ammonia gas.

The undoped GaN layer 20 may be grown by injecting trimethylgallium (TMGa) into the chamber together with hydrogen gas and ammonia gas.

The first conductivity-type semiconductor layer 30 may be a nitride semiconductor layer doped with impurity ions of the first conductivity type, and the first conductivity-type semiconductor layer 30 may include a first nitride layer 31 having a low refractive index and a second nitride layer 32 having a high refractive index.

The first conductivity-type semiconductor layer 30 may be a semiconductor layer doped with n-type impurity ions. The first conductivity-type semiconductor layer 30 may be grown by injecting trimethylgallium (TMGa), trimethylaluminum (TMAl), and silane gas ($SiN_4$) containing n-type impurities (for example, Si) into the chamber together with hydrogen gas and ammonia gas.

The first nitride layer 31 is formed on the undoped GaN layer 20, and the second nitride layer 32 is grown on the first nitride layer 31 to a predetermined thickness.

Figure 10:
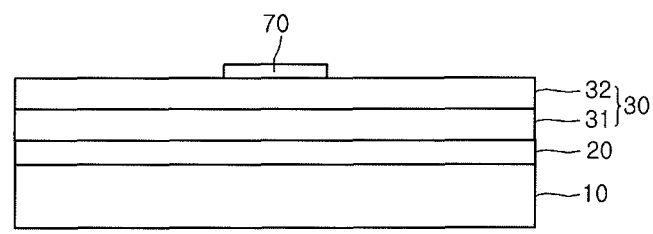

Referring to FIG. 10, a mask (not shown) is formed on the second nitride layer 32, and a current blocking layer 70 is formed of an insulating material. The current blocking layer 70 may be formed of at least one of $SiO_2$, $SiN_x$, $TiO_2$, $Ta_2O_3$, SiON, and SiCN. For example, when the current blocking layer 70 is formed of $SiO_2$, it can be formed through a CVD process by injecting silicon-containing gas such as $SiH_4$ or $Si_2H_6$ and oxygen-containing gas such as $N_2O$, $O_2$ or $O_3$.

In this case, the current blocking layer 70 may be formed as illustrated in FIGS. 10 and 17 or FIGS. 16 and 18 according to the pattern shapes of the mask (not shown).

Figure 11:
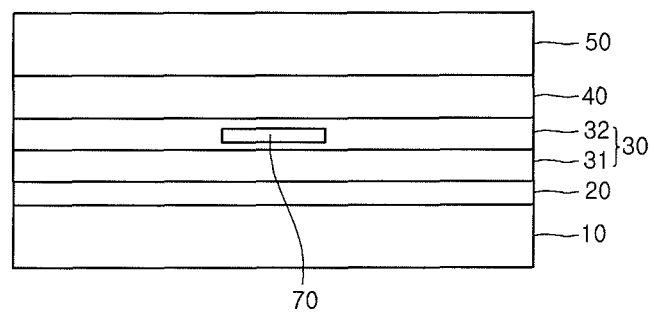

Referring to FIG. 11, the mask (not shown) is removed, and the second nitride layer 30 is additionally grown. As the second nitride layer 32 is additionally grown, the current blocking layer 70 is buried within the second nitride layer 32.

An active layer 40 and a semiconductor layer 50 of a second conductivity type are formed on the first conductivity-type semiconductor layer 30.

The active layer 40 may be formed in a single quantum well structure or a multi-quantum well structure. For example, the active layer 40 may be formed in a stacked structure of an InGaN well layer/a GaN barrier layer.

The second conductivity-type semiconductor layer 50 may be a nitride semiconductor layer doped with impurity ions of the second conductivity type. For example, the second conductivity-type semiconductor layer 50 may be a semiconductor layer doped with p-type impurity ions. The second conductivity-type semiconductor layer 50 may be grown by injecting bis(ethylcyclopentadienyl)magnesium ($EtCp_2Mg$) {$Mg(C_2H_5C_5H_4)_2$} into the chamber together with hydrogen gas and ammonia gas.

Figure 12:
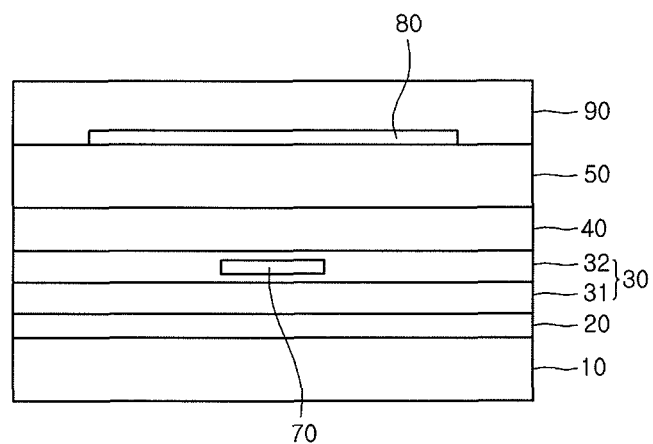

Referring to FIG. 12, an ohmic contact layer 80 and a second electrode layer 90 are formed on the second conductivity-type semiconductor layer 50.

The ohmic contact layer 80 may include a transparent electrode layer. For example, the ohmic contact layer 80 may be formed of at least one of indium tin oxide (ITO), ZnO, $RuO_x$, $TiO_x$, or $IrO_x$.

Also, the ohmic contact layer 80 may include at least one of a reflective layer and an adhesive layer.

The second electrode layer 90 may be formed of at least one of copper (Cu), titan (Ti), chrome (Cr), nickel (Ni), aluminum (Al), platinum (Pt), gold (Au), or a conductive substrate.

Figure 13:
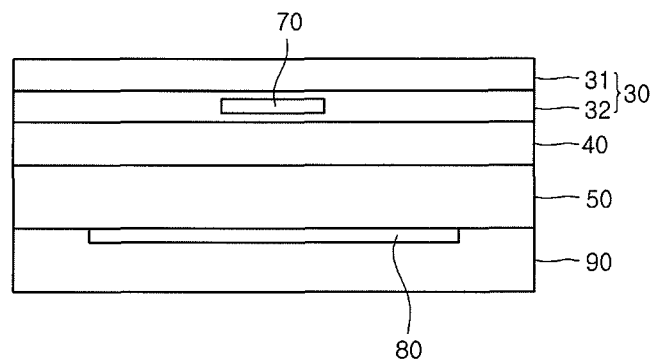

Referring to FIG. 13, the substrate 10 and the undoped GaN layer 20 are removed from the structure of FIG. 12. If the buffer layer has been formed, the buffer layer is also removed.

Figure 14:
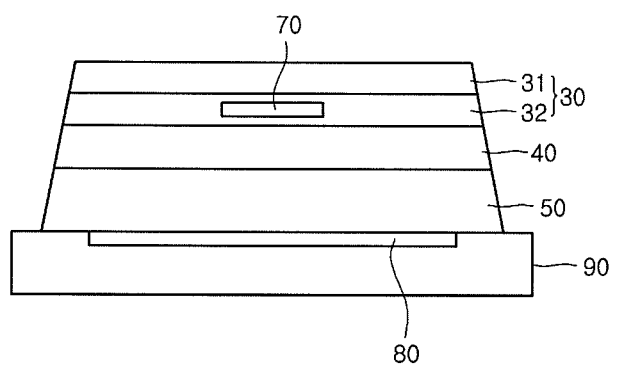

Referring to FIG. 14, an isolation etching process for chip separation is performed on the structure of FIG. 13.

Referring to FIG. 15, a first electrode layer 100 is formed on the first conductivity-type semiconductor layer 30. The first electrode layer 100 may be formed of at least one of copper (Cu), titan (Ti), chrome (Cr), nickel (Ni), aluminum (Al), platinum (Pt), or gold (Au).

In this way, the light emitting devices of FIGS. 15 and 16 can be manufactured.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
a second electrode layer;
a second conductivity-type semiconductor layer on the second electrode layer;
an ohmic contact layer located between the second electrode layer and the second conductivity-type semiconductor layer;
an active layer on the second conductivity-type semiconductor layer;
a first conductivity-type semiconductor layer on the active layer;
a current blocking layer in the first conductivity-type semiconductor layer; and
a first electrode layer on the first conductivity-type semiconductor layer,
wherein the first conductivity-type semiconductor layer comprises a first nitride layer and a second nitride layer, and the first nitride layer has a smaller refractive index than the second nitride layer.

2. The light emitting device according to claim 1, wherein at least portions of the first electrode layer, the second electrode layer, and the current blocking layer are overlapped in a vertical direction.

3. The light emitting device according to claim 1, wherein a top surface, a bottom surface, and a side surface of the current blocking layer are surrounded by the first conductivity-type semiconductor layer.

4. The light emitting device according to claim 1, wherein the current blocking layer is formed of at least one of $SiO_2$, $SiN_x$, $TiO_2$, $Ta_2O_3$, SiON, or SiCN.

5. The light emitting device according to claim 1, wherein the current blocking layer is provided in plurality and spaced apart from one another.

6. The light emitting device according to claim 1, wherein the current blocking layer is formed in the second nitride layer.

7. The light emitting device according to claim 1, wherein the first nitride layer comprises an AlGaN layer or an AlN layer, and the second nitride layer comprises a GaN layer.

8. The light emitting device according to claim 1, wherein a bottom surface and side surfaces of the ohmic contact layer are in contact with the second electrode layer, and
wherein a top surface of the ohmic contact layer and a top surface of the second electrode layer disposed on a substantially same horizontal plane.

9. A light emitting device, comprising:
a second electrode layer;
a second conductivity-type semiconductor layer on the second electrode layer;
a contact layer having a metal material and being located between the second electrode layer and the second conductivity-type semiconductor layer, a bottom surface and side surfaces of the contact layer being in contact with the second electrode layer;
an active layer on the second conductivity-type semiconductor layer;
a first conductivity-type semiconductor layer on the active layer;
a current blocking layer in the first conductivity-type semiconductor layer; and
a first electrode layer on the first conductivity-type semiconductor layer,
wherein the current blocking layer comprises a first current blocking layer and a second current blocking layer,
the first current blocking layer and the second blocking layer are spaced apart from each other within the first conductivity-type semiconductor layer,
a portion of the first conductivity-type semiconductor layer is disposed between the first current blocking layer and the second current blocking layer, and
the first conductivity-type semiconductor layer comprises a first nitride layer and a second nitride layer, and the first nitride layer has a smaller refractive index than the second nitride layer.

10. The light emitting device according to claim 9, wherein the first current blocking layer and the second current blocking layer are disposed on the active layer.

11. The light emitting device according to claim 9, wherein at least portions of the first electrode layer, the second electrode layer, and the current blocking layer are overlapped in a vertical direction.

12. The light emitting device according to claim 9, wherein a top surface, a bottom surface, and a side surface of the current blocking layer are surrounded by the first conductivity-type semiconductor layer.

13. The light emitting device according to claim 9, wherein the current blocking layer is formed of at least one of $SiO_2$, $SiN_x$, $TiO_2$, $Ta_2O_3$, SiON, or SiCN.

14. The light emitting device according to claim 9, wherein the current blocking layer is formed in the second nitride layer.

15. The light emitting device according to claim 9, wherein the first nitride layer comprises an AlGaN layer or an AlN layer, and the second nitride layer comprises a GaN layer.

16. A light emitting device, comprising:
a second electrode layer;
a second conductivity-type semiconductor layer on the second electrode layer;
a metallic layer located between the second electrode layer and the second conductivity-type semiconductor layer;
an active layer on the second conductivity-type semiconductor layer;
a first conductivity-type second nitride semiconductor layer on the active layer;
a first conductivity-type first nitride semiconductor layer on the first conductivity-type second nitride semiconductor layer;
a current blocking layer in the first conductivity-type second nitride semiconductor layer; and
a first electrode layer on the first conductivity-type first nitride semiconductor layer,
wherein the first conductivity-type first nitride semiconductor layer has a smaller refractive index than the first conductivity-type second nitride semiconductor layer, and
wherein an area of a top surface of the metallic layer is smaller than an area of a bottom surface of the second conductivity-type semiconductor layer.

17. The light emitting device according to claim 16, wherein at least portions of the first electrode layer, the second electrode layer, and the current blocking layer are overlapped in a vertical direction.

18. The light emitting device according to claim 16, wherein a top surface, a bottom surface, and a side surface of the current blocking layer are surrounded by the first conductivity-type second nitride semiconductor layer.

19. The light emitting device according to claim 16, wherein the current blocking layer is formed of at least one of $SiO_2$, $SiN_x$, $TiO_2$, $Ta_2O_3$, SiON, or SiCN.

20. The light emitting device according to claim 16, wherein the first conductivity-type first nitride semiconductor layer comprises an AlGaN layer or an AlN layer, and the first conductivity-type second nitride semiconductor layer comprises a GaN layer.

* * * * *